US009209382B2

(12) United States Patent
Glazunov et al.

(10) Patent No.: US 9,209,382 B2
(45) Date of Patent: Dec. 8, 2015

(54) PIEZOELECTRIC COMPONENT

(75) Inventors: Alexander Glazunov, Deutschlandsberg (AT); Oliver Dernovsek, Lieboch (AT)

(73) Assignee: EPCOS AG, Munich (DE)

( * ) Notice: Subject to any disclaimer, the term of this patent is extended or adjusted under 35 U.S.C. 154(b) by 570 days.

(21) Appl. No.: 13/575,596

(22) PCT Filed: Jan. 26, 2011

(86) PCT No.: PCT/EP2011/051069
§ 371 (c)(1),
(2), (4) Date: Oct. 19, 2012

(87) PCT Pub. No.: WO2011/092205
PCT Pub. Date: Aug. 4, 2011

(65) Prior Publication Data
US 2013/0038177 A1    Feb. 14, 2013

(30) Foreign Application Priority Data

Jan. 27, 2010   (DE) .......................... 10 2010 005 906

(51) Int. Cl.
*H01L 41/083*   (2006.01)
(52) U.S. Cl.
CPC .................. *H01L 41/0838* (2013.01)
(58) Field of Classification Search
CPC ....................................................... F03G 7/00
USPC .................................. 310/311, 328, 358, 366
See application file for complete search history.

(56) References Cited

U.S. PATENT DOCUMENTS

| 4,703,287 | A | * | 10/1987 | Fournier et al. | ................ 359/279 |
| 4,885,498 | A | | 12/1989 | Wakita | |
| 4,921,415 | A | | 5/1990 | Thomas, III et al. | |
| 5,300,852 | A | | 4/1994 | Isogai et al. | |
| 6,232,701 | B1 | | 5/2001 | Schuh et al. | |
| 7,208,862 | B2 | * | 4/2007 | Florian et al. | ................ 310/366 |
| 7,358,655 | B2 | | 4/2008 | Ragossnig et al. | |
| 7,449,077 | B2 | | 11/2008 | Heinzmann et al. | |
| 7,795,789 | B2 | | 9/2010 | Schuh | |
| 7,960,899 | B2 | | 6/2011 | Doellgast et al. | |
| 2003/0031622 | A1 | | 2/2003 | Eitel et al. | |
| 2003/0062806 | A1 | | 4/2003 | Ikeda et al. | |
| 2004/0051422 | A1 | * | 3/2004 | Kashiwaya et al. | .......... 310/324 |
| 2004/0100536 | A1 | * | 5/2004 | Junhua | ........................ 347/68 |
| 2005/0128030 | A1 | * | 6/2005 | Larson et al. | ................. 333/191 |
| 2007/0269667 | A1 | * | 11/2007 | Kobayashi et al. | .......... 428/469 |

FOREIGN PATENT DOCUMENTS

| CN | 1615550 A | 5/2005 |
| DE | 196 27 221 A1 | 1/1998 |
| DE | 101 21 271 A1 | 11/2002 |

(Continued)

*Primary Examiner* — Thomas Dougherty
(74) *Attorney, Agent, or Firm* — Slater & Matsil, L.L.P.

(57) ABSTRACT

A piezo electrical component has a stack of piezo electrical layers arranged over each other and electrode layers arranged therebetween. The stack has at least one first piezo electrical layer having a first piezo electrical charge constant and, directly adjacent thereto, at least one second piezo electrical layer having a second piezo electrical charge constant. The piezo electrical charge constant describes an expansion of the piezo electrical layer perpendicular to an electrical field at a voltage 6 applied to the electrode layers. The first piezo electrical charge constant is different from the second piezo electrical charge constant.

13 Claims, 5 Drawing Sheets

(56) References Cited

FOREIGN PATENT DOCUMENTS

| | | |
|---|---|---|
| DE | 102 01 641 A1 | 8/2003 |
| DE | 102 34 787 C1 | 10/2003 |
| DE | 103 07 825 A1 | 9/2004 |
| DE | 10 2004 050 803 A1 | 4/2006 |
| DE | 10 2005 015 112 A1 | 10/2006 |
| DE | 10 2007 022 093 A1 | 11/2008 |
| DE | 102004031404 B4 | 4/2010 |
| JP | 622267 U | 1/1987 |
| JP | 6240859 U | 3/1987 |
| JP | 2-222584 * | 9/1990 ............. H01L 41/09 |
| JP | 57029 A | 1/1993 |
| JP | 6232465 A | 8/1994 |
| JP | 8239267 A | 9/1996 |
| JP | 2005515641 A | 5/2005 |
| JP | 2005-354026 * | 12/2005 ....... B41J 2002/1425 |
| JP | 2009-049220 * | 3/2009 ............. H01L 41/09 |
| WO | 03061022 A2 | 7/2003 |
| WO | 2009101858 A1 | 8/2009 |

* cited by examiner

PIEZOELECTRIC COMPONENT

This patent application is a national phase filing under section 371 of PCT/EP2011/051069, filed Jan. 26, 2011, which claims the priority of German patent application 10 2010 005 906.4, filed Jan. 27, 2010, each of which is incorporated herein by reference in its entirety.

TECHNICAL FIELD

The invention relates to a piezoelectric component comprising piezoelectric layers.

BACKGROUND

Multilayer piezoelectric components, for instance multilayer piezoelectric actuators, comprise a plurality of layers of a piezoelectric material. Conventionally, the same piezoelectric material is used throughout the actuator.

Piezoelectric actuators are known from German patent documents DE 102 34 787 C1 and DE 103 07 825 A1

SUMMARY OF THE INVENTION

In one aspect of the invention a piezoelectric component has improved properties.

A piezoelectric component is provided, which comprises a stack of piezoelectric layers arranged on one another and electrode layers arranged between them, wherein the stack comprises at least one first piezoelectric layer having a first piezoelectric charge constant and, directly neighboring the latter, at least one second piezoelectric layer having a second piezoelectric charge constant. The piezoelectric charge constant describes an expansion of the piezoelectric layer perpendicular to an electric field when a voltage is applied to the electrode layers. The first piezoelectric charge constant is different from the second piezoelectric charge constant.

In particular, the piezoelectric component may be formed as a piezoactuator in multilayer design.

The piezoelectric charge constant serves as a measure of how great the expansion of the piezoelectric layers is perpendicular to an electric field when a predetermined voltage is applied to the electrode layers. If two materials having different piezoelectric charge constants are brought in contact with one another, a difference in mechanical stresses may occur at their contact interface due to the different expansion of the two materials during the polarization. This can promote the formation of cracks at the contact interface between the two materials.

These cracks may extend in a so-called inactive region of the actuator, in which there are only electrodes respectively assigned to the same electrical polarity, for example at the interface of the two piezoelectric layers, and therefore in the plane of the electrode layer. In case the cracks bend uncontrollably at the transition into a so-called active region of the actuator, in which electrodes having opposite polarity are arranged alternately above one another, they may bridge two or more electrode layers. Short circuits may occur in this case, which may lead to failure of the piezoelectric actuator. Consequently, the reliability and lifetime of a multilayer piezoelectric actuator depend crucially on the control over cracks possibly occurring. Bending of the cracks which occur can be prevented by the different piezoelectric charge constants of the first and second layers.

For the piezoelectric component described here, the first and second piezoelectric layers are preferably selected respectively such that a contact interface is formed between the two layers, the difference between the piezoelectric charge constants of the first piezoelectric layer and the second piezoelectric layer being sufficiently large such that, when a voltage is applied to the electrode layers, cracks are induced which preferably lie in the region of the contact interface and which extend essentially parallel to the electrode layers.

The described piezoelectric component consequently has the advantage that the region in which the cracks are formed can be predetermined. Furthermore, the profile of the cracks occurring can be predetermined. In particular, the mechanical stresses occurring in the piezoelectric material can be relaxed by using piezoelectric layers having different piezoelectric charge constants, such that cracks are generated in a controlled way, and in particular extending parallel to the electrode layers, while uncontrollably bending cracks can therefore be avoided. Bridging of two or more electrode layers by uncontrollably occurring and extending cracks can therefore be avoided.

In an advantageous embodiment, the piezoelectric component comprises no porous structures.

In contrast to cracks which bridge at least two electrode layers in the piezoelectric material, cracks which extend parallel or at least essentially parallel to the inner electrodes entail almost no restriction of the lifetime of actuators. Here, "essentially parallel" means that although the cracks do not necessarily extend entirely in a straight line and parallel in the mathematical sense, they nevertheless extend with a principal lengthwise direction along the electrode layers, while in particular not having a profile by which two or more electrode layers can be bridged.

In a preferred embodiment of the component, one of the two piezoelectric charge constants is greater by a factor of from 1.2 to 3.0 than the other of the two piezoelectric charge constants.

The greater the piezoelectric charge constant of a piezoelectric layer is, the greater is the expansion of the respective layer perpendicular to an electric field of predetermined strength generated by applying a voltage to the electrode layers. One of the two charge constants is greater by a factor of from 1.2 to 3.0, preferably by a factor of from 1.3 to 2.0, than the other of the two charge constants. Owing to the different expansion of the piezoelectric layers, which therefore takes place, local stresses can be generated in a controlled way and relaxed again such that controlled formation and a controlled profile of cracks is achieved at the contact interface between the piezoelectric layers. The lifetime of the piezoelectric material can therefore be increased significantly.

The first and second piezoelectric layers may have different Curie temperatures, which can lead to different piezoelectric charge constants of the respective layers.

The Curie temperature serves as a measure of the polarizability of the piezoelectric layer, and therefore as a measure of the extensibility of the layer in an electric field of predetermined strength. The Curie temperature of a piezoelectric layer has a direct correlation with the piezoelectric charge constant of the respective layer. In particular, the piezoelectric charge constant and therefore the extensibility of a piezoelectric material decrease with an increasing Curie temperature of the piezoelectric material.

In a preferred embodiment of the component, the difference between the Curie temperatures of the first piezoelectric layer and the second piezoelectric layer is from 20° C. to 200° C.

By means of an according selection of the Curie temperature of the piezoelectric layers, it is therefore possible to achieve a different expansion of the layers in the electric field, which leads to controlled crack formation in particular at the contact interface between the piezoelectric layers, as well as a profile of the cracks essentially parallel to the electrode layers. The difference between the Curie temperatures of the first and second piezoelectric layers may be from 20° C. to 200° C., preferably from 20° C. to 80° C. The difference between the Curie temperatures may for example be achieved by doping, in particular different doping, of the piezoelectric layers.

In a preferred embodiment of the component, the first and the second piezoelectric layers differ in terms of at least one of the following properties: ceramic material, dopant, dopant concentrations, particle sizes of the starting material respectively used, and/or layer thickness.

In order to produce the first and second piezoelectric layers with different piezoelectric charge constants, the layers may differ in terms of precisely one of the aforementioned properties or, alternatively, in terms of a plurality of the aforementioned properties. In this case, it may be advantageous with regard to the processability and the economic viability of the production process for the first and second piezoelectric layers to differ in terms of precisely one of the aforementioned properties or in terms of only few of the aforementioned properties.

The first piezoelectric layer may for example comprise a ceramic material containing lead, for instance based on lead zirconate titanate (PZT). The second piezoelectric layer may comprise a lead-free ceramic material. Alternatively, the first and second piezoelectric layers may each comprise a lead-free ceramic material and differ in terms of one of the aforementioned properties, for example the doping of the ceramic material.

According to one embodiment of the component, the first and second piezoelectric layers respectively comprise a ceramic material which is formed from a plurality of chemical elements, the elements respectively being present in a particular concentration. The first and second piezoelectric layers may differ from one another in terms of the concentration of at least one of the elements of the ceramic material.

In case that the first piezoelectric layer and the second piezoelectric layer each consist of PZT as ceramic material, the first and second piezoelectric layers may for example differ from one another in terms of the titanium content, i.e., the respective concentration of the element titanium.

According to one embodiment of the component, the first and second piezoelectric layers respectively comprise a ceramic material which is formed from the same chemical elements, the ceramic material comprising two different structures depending on the concentration of at least one of the elements in the ceramic material. The concentrations of the at least one element of the ceramic material in the first and second piezoelectric layers are respectively selected such that the first piezoelectric layer comprises the ceramic material with the first structure and the second piezoelectric layer comprises the ceramic material with the second structure.

In other words, the ceramic material may have a so-called morphotropic phase boundary which lies between the first structure and the second structure of the ceramic material. The first and second piezoelectric layers accordingly comprise a ceramic material having different concentrations of an element, such that the respective ceramic material has a phase transition depending on the concentration of the one element, and so that the ceramic material in the first piezoelectric layer is present in a different structure to the ceramic material in the second piezoelectric layer. The morphotropic phase boundary need not in this case characterize a sharply defined phase transition, but may also constitute a continuous transition between two crystal structures. The different first and second structures preferably lead to different piezoelectric charge constants in the first and second piezoelectric layers.

For example, PZT has a morphotropic phase boundary in a range of about 50 mol % titanium and about 50 mol % zirconate, these values depending on the precise composition of the ceramic material. With an increasing titanium content, starting at about 46 mol % titanium, the piezoelectric charge constant increases until the morphotropic phase boundary is exceeded, such that for the piezoelectric component, for example, the first piezoelectric layer may be selected with a titanium content of less than 46 mol %, and the second piezoelectric layer with a titanium content of about 48 mol %.

Selecting a ceramic material which is the same with regard to its elements for the first and second piezoelectric layers, which differ in terms of the concentrations of at least one element for the first and second piezoelectric layers, offers the advantage that it permits accurate control of the stresses in the piezoelectric layers at the contact interface between the first and second piezoelectric layers. In particular, it is possible to adapt the first and second piezoelectric charge constants through the difference between the concentrations of the at least one element in the ceramic material, i.e., in the example described above, for instance by modifying the titanium content in the ceramic material.

Here, dopants may be present, preferably in each case the same dopants and dopants in the same dopant concentrations. Using the same dopants for the first and second piezoelectric layers may offer particular advantages for the processing of the piezoelectric component, since chemical inhomogeneities between the first and second layers may thereby be kept small and therefore have no effect on the sintering behavior of the relevant piezoelectric layers. Special adaptation of the sintering shrinkage between the first and second piezoelectric layers is unnecessary in this case.

According to another configuration, the first and second piezoelectric layers comprise ceramic materials produced from starting powders having different particle sizes, the particle size of the starting powders being greater than or equal to 0.3 μm and less than or equal to 2.0 μm and the difference between the particle sizes of the starting powder being greater than or equal to 0.1 μm and less than or equal to 1.5 μm.

The ceramic layers of a piezoelectric component may be produced from so-called green sheets which, besides other constituents such as for instance sintering auxiliaries, comprise a ceramic powder. Electrode layers may be applied onto the green sheets, for example by a screen printing method. The green sheets are subsequently stacked and sintered together. In this case, ceramic materials which, although they are the same in terms of their chemical composition, but differ in terms of the particle sizes of the starting powders before the sintering process, may be suitable for producing the first and second piezoelectric layers with different piezoelectric charge constants. In particular, ceramic materials comprising a coarser starting powder usually have coarser grains after the sintering process, which can lead to an increase in the piezoelectric charge constant and therefore greater expansion of the piezoelectric material perpendicular to an electric field of predetermined strength.

For the particle size, it is in this case preferable to specify a median value d50 of the distribution of the particle sizes in the respective ceramic material. In what follows, the median value d50 will be referred to as the d50 particle size. The d50 particle size of the starting powders of the first and second piezoelectric layers before the sintering process may be greater than or equal to 0.3 μm and less than or equal to 2.0 μm, and it is preferably greater than or equal to 0.4 μm and less than or equal to 1.2 μm. The d50 particle size difference between the first piezoelectric layer and the d50 value of the second piezoelectric layer may be greater than or equal to 0.1 μm and less than or equal to 1.5 μm, and preferably greater than or equal to 0.3 μm and less than or equal to 1.0 μm. The aforementioned particle sizes and particle size differences can be particularly advantageous for the processability of the piezoelectric component, with at the same time a suitable selection of the first and second piezoelectric charge constants.

Furthermore, the first and second piezoelectric layers may differ in terms of the dopants added to them. In particular, the first and second piezoelectric layers may comprise the same ceramic material with the same elements and the same concentrations of each element, a different dopant being added to the ceramic material of the first piezoelectric layer than to the ceramic material of the second piezoelectric layer. In this case, the first piezoelectric layer may for example be doped with neodymium (Nd) while the second piezoelectric layer is doped with a mixture of zinc (Zn) and niobium (Nb). Such a dopant concentration can be advantageous in the case of PZT in particular, but also in the case of other ceramic materials.

Furthermore, the first and second piezoelectric layers may have different dopant concentrations. In this case, the two layers may also comprise the same dopant. For PZT as the ceramic material and a mixture of Zn and Nb as dopants, for example, the first piezoelectric layer may have a dopant concentration of 2 mol %, and the second piezoelectric layer may have a dopant concentration of 5 mol %. The respective dopants and dopant concentrations in this case depend on the respective ceramic materials and the preferred piezoelectric charge constants for the first piezoelectric layer and the second piezoelectric layer.

According to another embodiment of the component, the first piezoelectric layer has a first layer thickness and the second piezoelectric layer has a second layer thickness, the first and second layer thicknesses being different to one another and the ratio of the first and second layer thicknesses being greater than or equal to 1.1 and less than or equal to 3.0.

By adjusting the first and second layer thicknesses it may be possible to adapt the first and second piezoelectric charge constants in the layers. The difference between the first layer thickness and the second layer thickness, in relation to a normal layer thickness, may be greater than or equal to 1.1 and less than or equal to 3.0, and preferably greater than or equal to 1.3 and less than or equal to 2.5.

According to at least one embodiment of the component, the stack of the piezoelectric component comprises a sequence of layers arranged directly on one another, the sequence being formed from a first electrode layer having a first polarity when a voltage is applied to the electrode layers, the first piezoelectric layer, a second electrode layer having a second polarity when a voltage is applied to the electrode layers, the second piezoelectric layer and a further first electrode layer.

The first piezoelectric layer is therefore respectively arranged between first and second electrode layers neighboring one another in the stack direction, while the second piezoelectric layer is arranged between the same second electrode layer and a further first electrode layer neighboring the second electrode layer.

According to at least one other embodiment, the stack of the piezoelectric component comprises a sequence of layers arranged directly on one another, the sequence being formed from a first electrode layer having a first polarity when a voltage is applied to the electrode layers, the first piezoelectric layer, the second piezoelectric layer and a second electrode layer, neighboring the first electrode layer, having a second polarity when a voltage is applied to the electrode layers. The first and second piezoelectric layers thus both lie between a first electrode layer and a second electrode layer neighboring the latter.

Furthermore, the two aforementioned sequences of layers arranged directly above one another may be arranged in a single piezoelectric component.

According to one embodiment of the component, the number of first piezoelectric layers is different to the number of second piezoelectric layers.

The piezoelectric component may, in particular, comprise a stack, having precisely one second piezoelectric layer and a multiplicity of first piezoelectric layers. As an alternative to this, the piezoelectric component may also comprise a multiplicity of second piezoelectric layers. Preferably, 5%-20% of all the layers in the stack are second piezoelectric layers.

According to one embodiment of the invention, the stack comprises an equal number of first and second piezoelectric layers, such that half of all the piezoelectric layers in the stack are first piezoelectric layers and half are second piezoelectric layers.

BRIEF DESCRIPTION OF THE DRAWINGS

Piezoelectric components will be described by way of example below in order to explain the embodiments described here, in conjunction with FIGS. 1 to 10, in which.

DETAILED DESCRIPTION OF ILLUSTRATIVE EMBODIMENTS

In the exemplary embodiments and figures, constituents which are the same or have the same effect may respectively be provided with the same references. The elements represented, and the relative size ratios thereof are in principle not to be regarded as true to scale; rather, individual elements, for example layers, components, parts and regions may be represented exaggeratedly thick or with large dimensions for better representation or better understanding.

Figure 1:
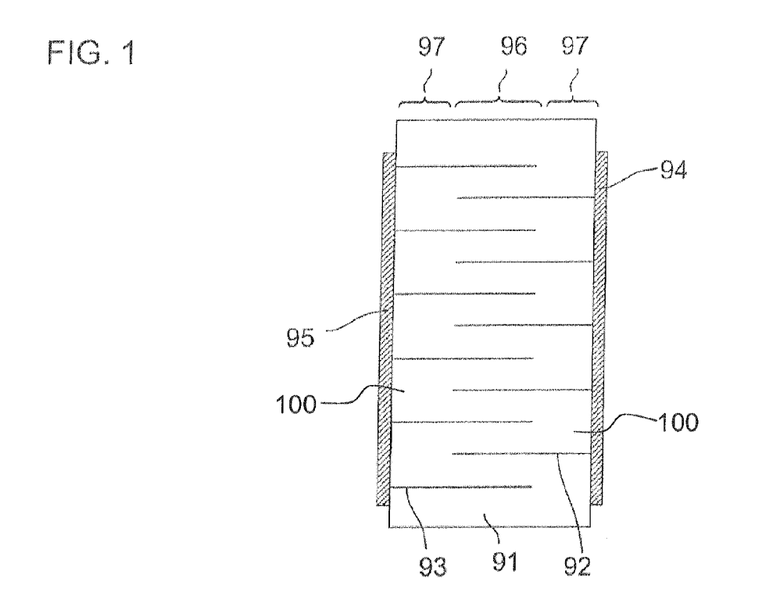
FIG. 1 shows a schematic illustration of a piezoelectric actuator.

FIG. 1 shows a multilayer piezoelectric actuator, which comprises a stack 91 of a plurality of layers 100 of a piezoelectric material and inner electrodes 92, 93 between the piezoelectric layers 100. The same piezoelectric material is in this case used throughout the actuator.

In order to be able to contact the inner electrodes 92, 93 easily, the actuator is formed such that only inner electrodes 92, 93 respectively assigned to the same electrical polarity extend as far as an edge region, a so-called inactive region 97 of the actuator. The inner electrodes 93, 92 assigned to the other electrical polarity do not extend as far as the edge of the actuator at this position. In an inner region of the actuator, a so-called active region 96, the inner electrodes 92, 93 of opposite polarity are arranged alternately above one another. The inner electrodes 92, 93 are accordingly formed respectively in a kind of comb structure in the form of combs inserted into one another. Via contact surfaces in the form of metallizations 94, 95 on the outer side of the stack 91, an electrical voltage can be applied to the inner electrodes 92, 93.

In the active region 96 of the stack 91, in which the inner electrodes 92, 93 are arranged alternately above one another, an electric field is set up by applying an electrical voltage to the inner electrodes 92, 93.

An expansion of the piezoelectric material of the actuator is induced in this way. In the inactive region 97 of the stack 91, only a very small electric field is set up by applying an electrical voltage to the inner electrodes 92, 93, such that the piezoelectric material expands very little in these regions. This leads to tensile stresses, particularly in the inactive regions 97, which can cause cracks (see cracks 98 and 99 in FIGS. 2A and 2B).

Figure 2A:
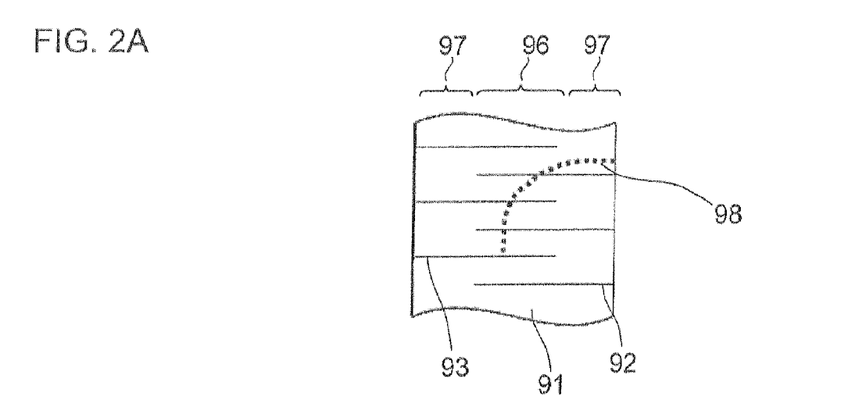
FIGS. 2a and 2b show schematic illustrations of a piezoelectric actuator.
Figure 2B:
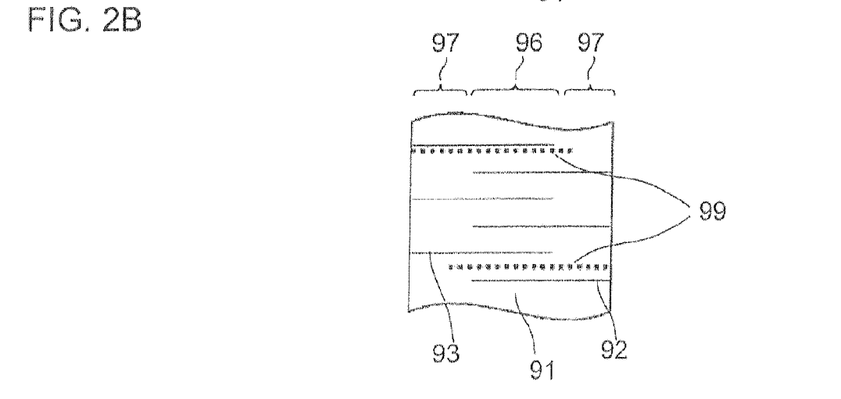

FIGS. 2A and 2B show schematic illustrations of piezoelectric actuators. In particular, FIGS. 2A and 2B show a subregion of the stack 91 represented in FIG. 1.

As shown in FIG. 2B, when an electrical voltage is applied to the inner electrodes 92, 93, cracks 99 extending substantially parallel to the inner electrodes 92, 93 can form in the active and inactive regions due to the different expansion of the piezoelectric material. In contrast to the exemplary embodiment represented in FIG. 2A, the cracks extending substantially parallel to the inner electrodes 92, 93 do not lead to breakdown of the actuator.

Besides, however, as shown in FIG. 2A, cracks 98 are also formed in piezoelectric actuators which bend at the transition from the inactive region 97 to the active region 96 and, as indicated in FIG. 2A, can thereby bridge the inner electrodes 92, 93 such that short circuits are formed. Such a crack 98 leads to failure of the piezoelectric actuator.

Figure 3:
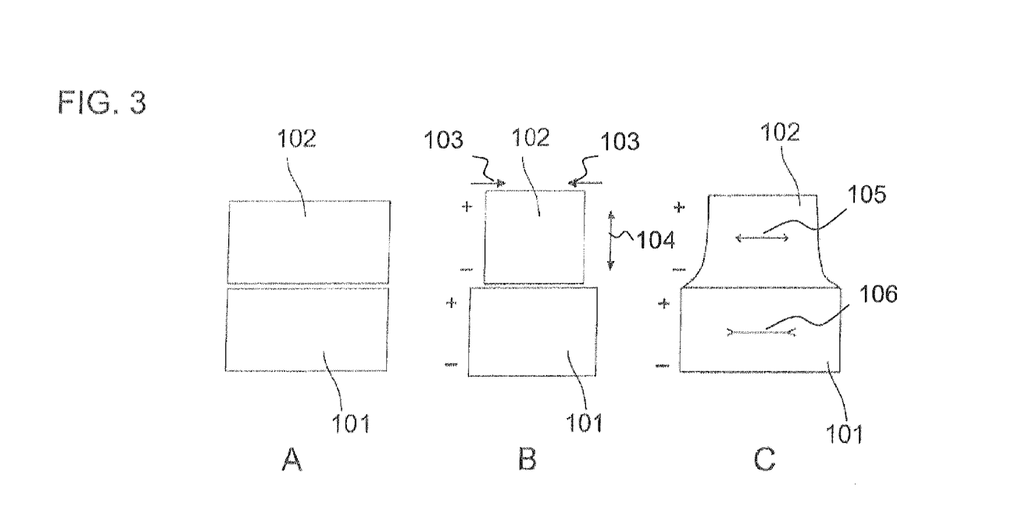
FIGS. 3a to 3c show schematic illustrations of piezoelectric materials according to one embodiment.

FIGS. 3A to 3C show schematic illustrations of piezoelectric materials according to one embodiment. The piezoelectric materials are suitable for use in a multilayer piezoelectric actuator.

In this case, as represented in FIG. 3A, a first piezoelectric material 101 has a first piezoelectric charge constant d31. A second piezoelectric material 102 has a second piezoelectric charge constant d31. Preferably, one of the two charge constants d31 is greater by a factor of from 1.3 to 2.0 than the other one of the two charge constants d31. In the exemplary embodiment shown, the second piezoelectric charge constant d31 is greater than the first piezoelectric charge constant d31. For example, the second piezoelectric charge constant d31 is two times as great as the first piezoelectric charge constant d31. Alternatively, however, the first piezoelectric charge constant d31 may also have a greater value than the second piezoelectric charge constant d31.

The piezoelectric charge constant d31 is in this case a measure for the expansion of the piezoelectric material perpendicular to an electric field when a voltage is applied to the electrode layers (not explicitly represented here).

FIG. 3B schematically shows the deformation of the first and second piezoelectric materials 101, 102 after an electrical voltage is applied to the electrode layers in the absence of mechanical contact between the first and second piezoelectric materials 101, 102. The electric field formed when the voltage is applied is in this case indicated by the plus and minus signs, the electrode layers not being shown for the sake of simplicity. The deformation caused by the electric field is illustrated by way of example for the piezoelectric material 102 by the arrows 103, 104. Arrow 103 indicates in this case the deformation of the material 102 perpendicular to the field lines of the electric field. Arrow 104 indicates the deformation parallel to the field lines of the electric field. The second piezoelectric material 102, with the greater piezoelectric charge constant, expands more strongly in this case than the first piezoelectric material 101.

If the piezoelectric materials 101, 102 are brought into contact with one another and subsequently sintered together, a deformation of the first and second piezoelectric materials 101, 102 takes place when an electrical voltage is applied to the electrode layers (not represented here), as represented in FIG. 3C. Since the first and second piezoelectric materials 101, 102 are firmly connected to one another, mechanical stresses are formed at the contact interface between the two materials 101, 102 due to the different expansions of the materials 101, 102 in the electric field, and the resulting compressive stress 106 in the material 101 and the tensile stress 105 in the material 102. At the contact interface between the first and the second piezoelectric materials 101, 102, a gradient of the stresses is therefore set up which is intended to lead to the formation of cracks in this region. The cracks thereby formed extend essentially parallel to the contact interface and, in particular, to the electrode layers, so that bridging of two or more electrode layers is prevented. Accordingly, due to the different piezoelectric charge constants d31 and the therefore different expansions of the materials 101, 102 mechanical stresses are induced such that uncontrollably bending cracks (see for example crack 98, FIG. 2A), are avoided and cracks extending in a controlled way, in particular parallel to the electrode layers, are promoted at the contact interface between the first and second piezoelectric materials 101, 102.

Figure 4:
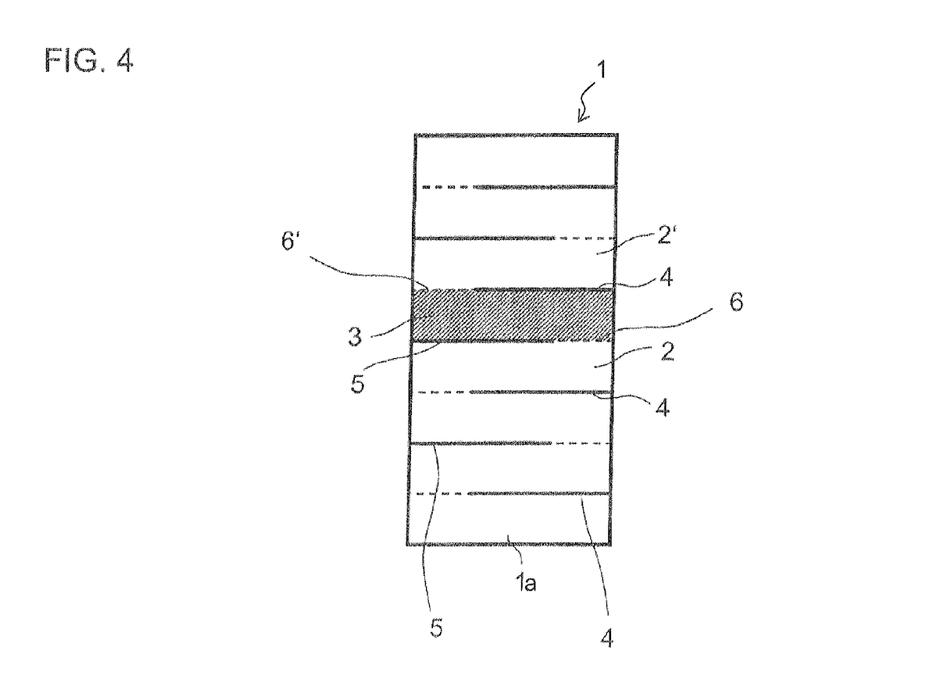
FIG. 4 shows a schematic illustration of a piezoelectric component according to one embodiment.

FIG. 4 shows a schematic illustration of a piezoelectric component according to one embodiment.

FIG. 4 shows a piezoelectric component 1, which is configured as a piezoactuator in multilayer design and comprises a stack 1a of piezoelectric layers 2, 2', 3 arranged above one another and first and second electrode layers 4, 5 arranged between them. For reasons of clarity, only the piezoactuator layers 2, 2' and 3, as well as some of the first electrode layers 4 and of the second electrode layers 5 are provided with references. The dashed lines are provided in order to illustrate the piezoelectric layers.

The stack 1a comprises at least one first piezoelectric layer 2 having a first piezoelectric charge constant d31 and, directly neighboring the latter, at least one second piezoelectric layer 3 having a second piezoelectric charge constant d31. The first and the second piezoelectric charge constants d31 are different from each other. For example, the second piezoelectric charge constant d31 is two times as great as the first piezoelectric charge constant d31. Alternatively, the first piezoelectric charge constant d31 may also be greater than the second piezoelectric charge constant d31. For the sake of clarity, metallizations on outer sides of the stack 1, for contacting the first and second electrode layers 4, 5 and connecting them to an electrical voltage, are not shown. The electrode layers 4, 5 in this exemplary embodiment are made of copper. Alternatively, the electrode layers 4, 5 may for example, also comprise one of the following materials or following mixtures of materials: silver, platinum, an alloy or mixture of copper and palladium, an alloy or mixture of silver and palladium, an alloy or mixture of platinum and silver.

The first piezoelectric layer 2 and the second piezoelectric layer 3 are respectively arranged between two neighboring electrode layers 4, 5, such that the stack 1a in this exemplary embodiment comprises a sequence of layers, which is formed by a first electrode layer 4 having a first polarity when a voltage is applied to the electrode layers 4, 5, the first piezoelectric layer 2, a second electrode layer 5 having a second polarity when a voltage is applied to the electrode layers 4, 5, the second piezoelectric layer 3, and a further first electrode layer 4. In the exemplary embodiment shown in FIG. 4, the number of the first piezoelectric layers 2, 2' is different to the number of the second piezoelectric layers 3. In particular, the piezoelectric component comprises precisely one second piezoelectric layer 3 and a multiplicity of first piezoelectric layers 2, 2'. Furthermore, the piezoelectric component may also comprise a multiplicity of second piezoelectric layers 3 (see, for example, FIG. 5).

As described in connection with FIGS. 3A to 3C, the piezoelectric charge constants d31 of the first piezoelectric layer 2 and the second piezoelectric layer 3 differ such that local stresses due to the different expansions of the piezoelectric layers 2, 3 perpendicular to the electric field are formed at a contact interface 6 between the first piezoelectric layer 2 and the second piezoelectric layer 3 during heat treatments, during the metallization, during the soldering, during the poling process or during operation of the piezoelectric component. These local stresses lead to the formation of cracks in the region of the contact interface 6. The cracks in this case extend essentially parallel to the electrode layers 4, 5.

Furthermore, the stack 1a comprises a further first piezoelectric layer 2', which is likewise arranged directly neighboring the second piezoelectric layer 3 and has a further contact interface 6' with the second piezoelectric layer 3, at which cracks that extend essentially parallel to the electrode layers 4, 5 can likewise be formed.

The first piezoelectric layers 2, 2' and the second piezoelectric layer 3 in this exemplary embodiment each comprise a ceramic material based on lead zirconate titanate (PZT). The second piezoelectric layer 3 has a composition with a different concentration of the constituent titanium to the first piezoelectric layers 2, 2', which leads to the different piezoelectric charge constants d31 of the first and second layers 2, 2', 3. The layer thicknesses of the piezoelectric layers 2, 2', 3 are equal in the exemplary embodiment shown, although they may also be different from one another.

Additionally or alternatively, the first and second piezoelectric layers 2, 2', 3 in this and the other exemplary embodiments may differ with regard to the respective ceramic material, the dopant, the dopant concentrations or the particle sizes of the starting material respectively used, in order to achieve the different piezoelectric charge constants d31 of the first piezoelectric layers 2, 2' and the second piezoelectric layer 3. For example, the first piezoelectric layer 2, 2' may comprise a ceramic material containing lead, for example PZT. The second piezoelectric layer 3 may comprise a lead-free ceramic material.

Additionally or alternatively, the first piezoelectric layers 2, 2', and the second piezoelectric layer 3 may have different piezoelectric charge constants d31 because of the fact that they have different Curie temperatures.

Exemplary embodiments of the expansion of the piezoelectric materials, the Curie temperatures and the piezoelectric charge constants d31 of corresponding piezoelectric materials are described in connection with FIGS. 8 to 10.

Figure 5:
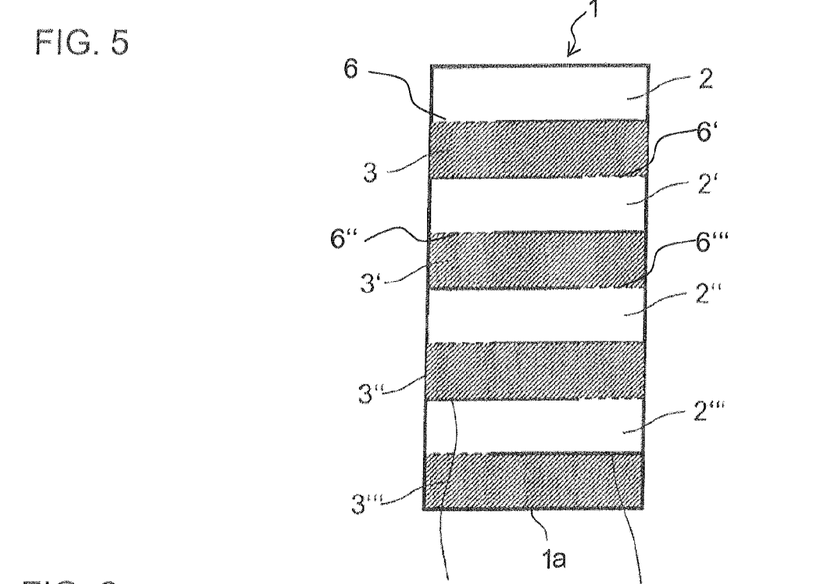
FIG. 5 shows a schematic illustration of a piezoelectric component according to another embodiment.

FIG. 5 shows a schematic illustration of a piezoelectric component according to another embodiment.

In comparison with the exemplary embodiment of FIG. 4, besides a multiplicity of first piezoelectric layers 2, 2', 2''', 2''', the stack 1a of the piezoelectric component also comprises a multiplicity of second piezoelectric layers 3, 3', 3'', 3''', the first and second piezoelectric layers being arranged alternately above one another such as to form a multiplicity of contact interfaces 6, 6', 6'', 6''' at which cracks can form in a controlled way. In the exemplary embodiment shown, the stack 1a comprises an equal number of first and second piezoelectric layers, such that 50% of all the piezoelectric layers in the stack 1a are formed as second piezoelectric layers 3.

In this exemplary embodiment as well, the stack 1a comprises a sequence of layers which is formed by a first electrode layer 4 having a first polarity when a voltage is applied to the electrode layers 4, 5, a first piezoelectric layer 2, a second electrode layer 5 having a second polarity when a voltage is applied to the electrode layers 4, 5, a second piezoelectric layer 3, and a further first electrode layer 4.

Figure 6:
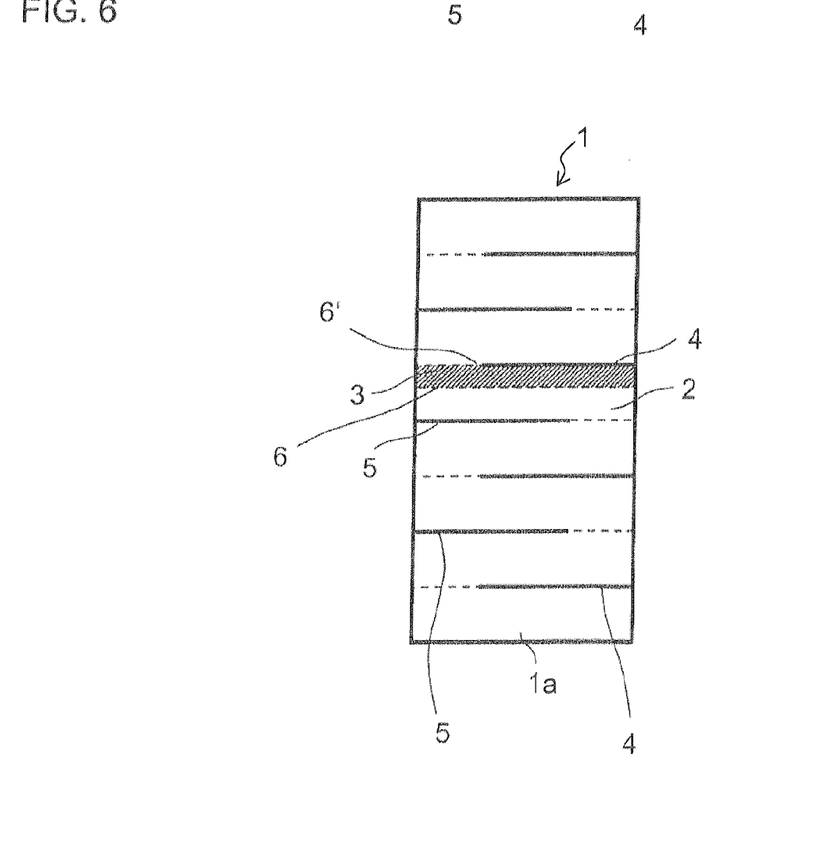
FIG. 6 shows a schematic illustration of a piezoelectric component according to another embodiment.
Figure 7:
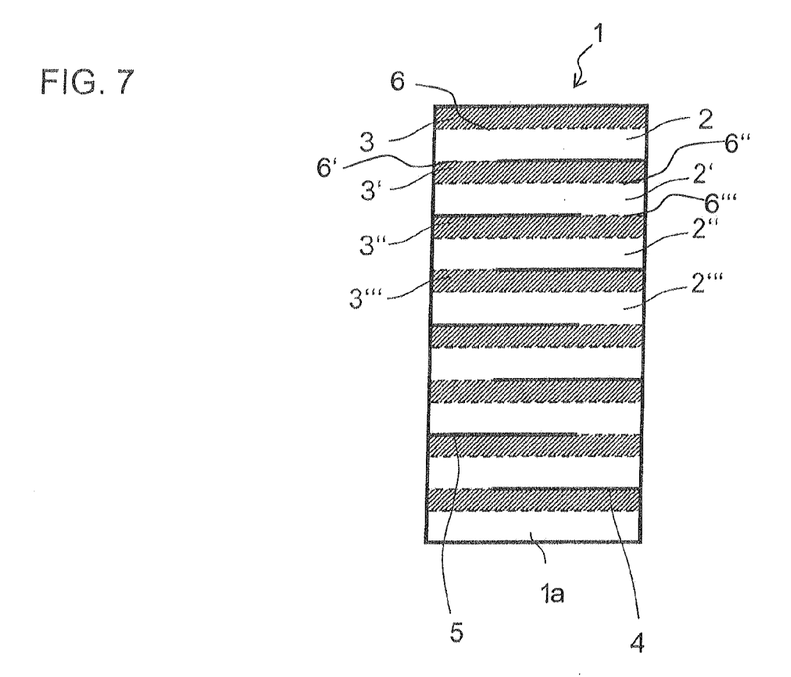
FIG. 7 shows a schematic illustration of a piezoelectric component according to another embodiment.

FIGS. 6 and 7 show a schematic illustrations of a piezoelectric component according to another embodiment.

Further exemplary embodiments of piezoelectric components are shown in FIGS. 6 and 7, which differ from the exemplary embodiments in FIGS. 4 and 5 in that a first and a second piezoelectric layer 2, 3, are arranged directly neighboring one another and, in particular, together between a first electrode layer 4 and a second electrode layer 5 neighboring the latter.

According to the exemplary embodiment in FIG. 6, a first piezoelectric layer 2 and, directly neighboring the latter, a second piezoelectric layer 3, are arranged only once between two neighboring electrode layers 4, 5 in the stack 1a. Besides, the stack 1a comprises a multiplicity of first piezoelectric layers 2 between two neighboring electrode layers 4, 5.

According to the exemplary embodiment in FIG. 7, a first and a second piezoelectric layer 2, 2', 2'', 2''', 3, 3', 3'', 3''' are arranged between all neighboring electrode layers 4, 5. Between two neighboring electrode layers 4, 5, a contact interface 6, 6', 6'', 6''' is thus respectively formed, at which cracks can form in a targeted way.

As an alternative to the exemplary embodiments of FIGS. 6 and 7, more than one first and one second piezoelectric layer may also be arranged between two neighboring electrode layers 4, 5. Moreover, all the features described in connection with the exemplary embodiments of FIGS. 4 and 5 apply for the exemplary embodiments described in FIGS. 6 and 7.

Figure 8:
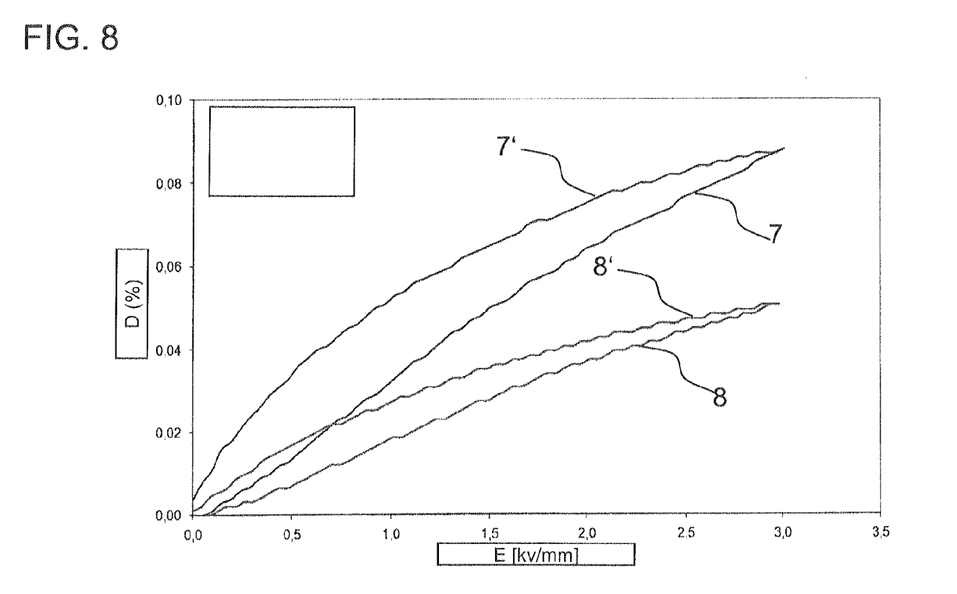
FIG. 8 shows a graph of the expansion D of two different piezoelectric materials as a function of the electric field strength E.

FIG. 8 shows a graph with curves, 7, 7', 8 and 8' for the percentage expansion D of two different piezoelectric materials, shown by way of example, perpendicular to the electric field as a function of the electric field strength E in kV/mm. First and second piezoelectric layers of the exemplary embodiments described above may be produced from the piezoelectric materials.

The piezoelectric material, the expansion D of which perpendicular to the electric field is represented in the curves 7, 7', has a piezoelectric charge constant d31 of 290 pC/N. The piezoelectric material, the expansion D of which perpendicular to the electric field is represented in the curves 8, 8', has a piezoelectric charge constant d31 of 170 pC/N. The curves 7, 8 respectively show the expansion D of the corresponding piezoelectric material when the electric field is being set up. The curves 7', 8' respectively show the expansion D of the corresponding piezoelectric material when the electric field is being turned off. Accordingly, the expansion D perpendicular to the electric field for a given field strength E in the case of the two piezoelectric materials is greater when turning off the electric field than when setting up the electric field, such that a hysteresis curve 7, 7' or 8, 8' is to be observed for the respective piezoelectric material.

For both piezoelectric materials, the expansion D grows with an increasing electric field strength E up to a maximum field strength E represented here of about 3 kV/mm. In the material of curve 7, 7', for which the piezoelectric charge constant d31 is greater than in the material of curve 8, 8', a high expansion D of up to 0.085% in the direction perpendicular to the electric field is achieved at a maximum electric field strength E of 3.0 kV/mm. The material of curve 8, 8', having the smaller piezoelectric charge constant d31, has on the other hand a much smaller expansion D of 0.045% at the maximum electric field strength E of 3 kV/mm. Consequently, the difference in the piezoelectric charge constants d31, and therefore the difference in the maximum expansion D of the respective piezoelectric material, is approximately a factor of 2 in this exemplary embodiment.

Figure 9:
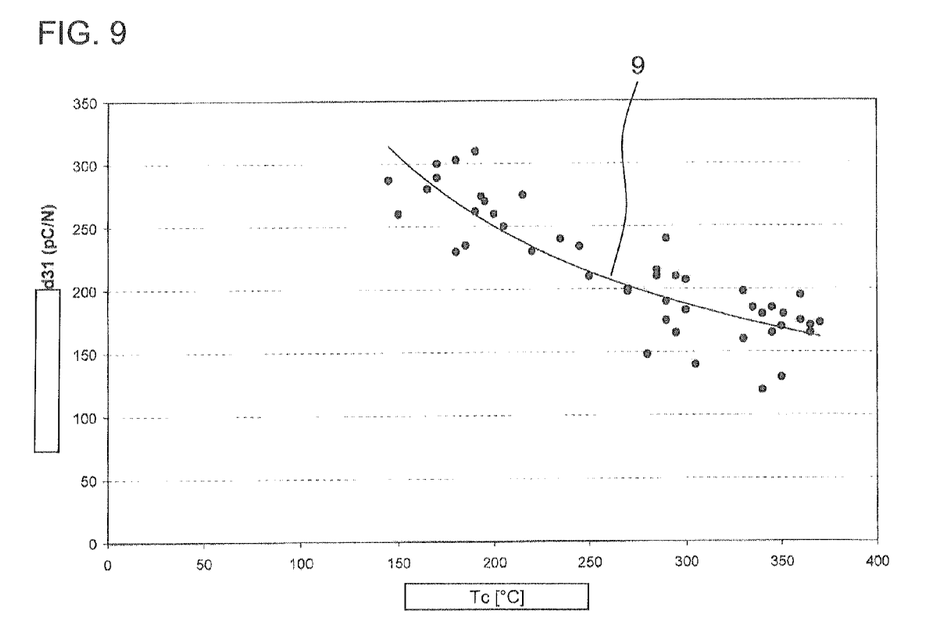
FIG. 9 shows a graph of the piezoelectric charge constant d31 of different piezoelectric materials as a function of the respective Curie temperature $T_C$.

FIG. 9 represents a graph which shows a dependency of the piezoelectric charge constants d31 in pC/N of various PZT-based piezoelectric materials on the respective Curie temperature $T_C$. The Curie temperatures $T_c$ of the piezoelectric materials in this case lie between about 150° C. and about 350° C. The value of the charge constants d31 decreases with an increasing Curie temperature $T_C$ of the respective material. Thus, the higher the Curie temperature $T_C$ of a piezoelectric material is, the less is the expansion of the material in an electric field of predetermined strength. By means of suitable selection of the Curie temperatures $T_C$ of the piezoelectric layers, it is therefore possible to achieve a different expansion of the layers in an electric field of predetermined strength, which leads to controlled crack formation in particular at the contact interface between the piezoelectric layers, as well as a profile of the cracks essentially parallel to the electrode layers.

It can be seen from FIG. 9 that, for piezoelectric materials having the same Curie temperature $T_C$, there is a spread of the values for the piezoelectric charge constant d31, which at 300° C. lies between 150 pC/N and 240 pC/N. This spread may be caused by physical effects, for example blocking of domain conversions by defects in the ceramic material.

Figure 10:
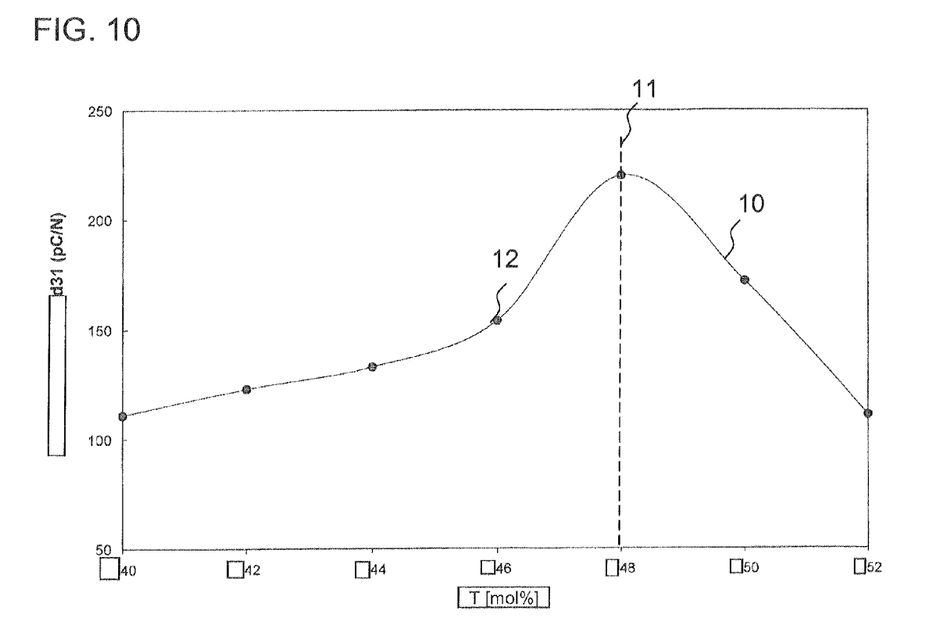
FIG. 10 shows a graph of the piezoelectric charge constant d31 as a function of the titanium content T in a piezoelectric material based on lead zirconate titanate.

FIG. 10 shows a graph 10 of the dependency of the piezoelectric charge constant d31 on the titanium content T, in a piezoelectric material based on lead zirconate titanate according to one exemplary embodiment. The reference 11 indicates a morphotropic phase boundary of the piezoelectric material, which lies at a titanium concentration of about 48 mol %. With an increasing titanium content T, after exceeding the morphotropic phase boundary a reduction of the piezoelectric charge constant d31 can be seen.

For the first piezoelectric layer and the second piezoelectric layer, ceramic materials such as for example PZT with the same composition may be selected, which have different piezoelectric charge constants d31 on different sides of the morphotropic phase boundary 11 owing to the respective titanium content T in the ceramic material. Thus, for example, a material having a titanium content T of less than about 48 mol %, preferably 46 mol % (indicated by point 12 in FIG. 10) may be selected for the first piezoelectric layer, and a material having a titanium content T around about 48 mol % (indicated by a point in the vicinity of the morphotropic phase boundary 11 in FIG. 10) may be selected for the second piezoelectric layer, such that the first piezoelectric charge constant d31 is less than the second piezoelectric charge constant d31.

The ceramic materials explicitly referred to above are mentioned purely by way of example, and are not to be interpreted as a restriction of the described embodiments. Rather, the embodiments and exemplary embodiments described above may also comprise piezoelectric ceramic materials other than the ceramic materials mentioned.

The invention claimed is:

1. A piezoelectric component comprising:
a stack of piezoelectric layers arranged on one another and electrode layers arranged between the piezoelectric layers, wherein the stack comprises at least one first piezoelectric layer having a first piezoelectric charge constant;
a second piezoelectric layer directly neighboring the first piezoelectric layer and having a second piezoelectric charge constant, the piezoelectric charge constant describing an expansion of the piezoelectric layer perpendicular to an electric field when a voltage is applied to the electrode layers, wherein one of the first piezoelectric charge constant and the second piezoelectric charge constant is greater than the other piezoelectric charge constant by a factor of from 1.2 to 3.0; and
a contact interface separating the first piezoelectric layer and the second piezoelectric layer, wherein applying the voltage to the electrode layers results in different expansion of the first piezoelectric layer and the second piezoelectric layer to form cracks at the contact interface and guide the cracks along the contact interface, the different expansion resulting from the difference in the first piezoelectric charge constant and the second piezoelectric charge constant.

2. The piezoelectric component according to claim 1, wherein an expansion of the piezoelectric layers leads to formation of cracks which extend essentially parallel to the electrode layers.

3. The piezoelectric component according to claim 1, wherein the first piezoelectric layer and the second piezoelectric layer have different Curie temperatures.

4. The piezoelectric component according to claim 3, wherein the difference between the Curie temperatures of the first piezoelectric layer and the second piezoelectric layer is from 20° C. to 200° C.

5. The piezoelectric component according to claim 1, wherein the first piezoelectric layer and the second piezoelectric layer differ in terms of at least one of the following properties: ceramic material, dopant, dopant concentrations, particle sizes of the starting material, and/or layer thickness.

6. The piezoelectric component according to claim 5, wherein the first and second piezoelectric layers each comprise a ceramic material that is formed from a plurality of elements, the elements being present in a particular concentration and the first and second piezoelectric layers differing from one another in terms of the concentration of at least one of the elements of the ceramic material.

7. The piezoelectric component according to claim 6, wherein the first and second piezoelectric layers are formed from a ceramic material comprising the same elements, the ceramic material comprising two different structures depending on the concentration of at least one of the elements in the ceramic material and the concentrations of the at least one element of the ceramic material in the first and second piezoelectric layers respectively being selected such that the first piezoelectric layer comprises the ceramic material with the first structure and the second piezoelectric layer comprises the ceramic material with the second structure.

8. The piezoelectric component according to claim 5, wherein the first and second piezoelectric layers comprise ceramic materials produced from starting powders having different particle sizes, the particle size of the starting powders being greater than or equal to 0.3 μm and less than or equal to 2.0 μm and the difference between the particle sizes of the starting powders being greater than or equal to 0.1 μm and less than or equal to 1.5 μm.

9. The piezoelectric component according to claim 5, wherein the first piezoelectric layer has a first layer thickness and the second piezoelectric layer has a second layer thickness, the first and second layer thicknesses being different from one another and the ratio of the first and second layer thicknesses being greater than or equal to 1.1 and less than or equal to 3.0.

10. The piezoelectric component according to claim 1, wherein the stack comprises a sequence of layers arranged directly on one another, the sequence being formed from a first electrode layer having a first polarity when a voltage is applied to the electrode layers, the first piezoelectric layer, a second electrode layer having a second polarity when a voltage is applied to the electrode layers, the second piezoelectric layer and a further first electrode layer.

11. The piezoelectric component according to claim 1, wherein the stack comprises a sequence of layers arranged directly on one another, the sequence being formed from a first electrode layer having a first polarity when a voltage is applied to the electrode layers, the first piezoelectric layer, the second piezoelectric layer and a second electrode layer, neighboring the first electrode layer and having a second polarity when a voltage is applied to the electrode layers.

12. The piezoelectric component according to claim 1, wherein the number of first piezoelectric layers is different from the number of second piezoelectric layers.

13. The piezoelectric component according to claim 1, wherein the stack comprises an equal number of first and second piezoelectric layers.

* * * * *